US008632226B2

(12) United States Patent
Hata et al.

(10) Patent No.: US 8,632,226 B2
(45) Date of Patent: Jan. 21, 2014

(54) LIGHTING SYSTEM

(75) Inventors: Toshio Hata, Osaka (JP); Shinya Ishizaki, Osaka (JP); Makoto Agatani, Osaka (JP)

(73) Assignee: Sharp Kabushiki Kaisha, Tokyo (JP)

( * ) Notice: Subject to any disclaimer, the term of this patent is extended or adjusted under 35 U.S.C. 154(b) by 34 days.

(21) Appl. No.: 13/275,037

(22) Filed: Oct. 17, 2011

(65) Prior Publication Data
US 2012/0106155 A1    May 3, 2012

(30) Foreign Application Priority Data

Oct. 27, 2010   (JP) ................................. 2010-241486

(51) Int. Cl.
*F21V 7/00*     (2006.01)
*F21V 23/00*    (2006.01)

(52) U.S. Cl.
USPC ....................... 362/342; 362/249.02; 362/297

(58) Field of Classification Search
USPC ..................................... 362/249.02, 297, 342
See application file for complete search history.

(56) References Cited

U.S. PATENT DOCUMENTS

| | | | | |
|---|---|---|---|---|
| 5,836,676 A | * | 11/1998 | Ando et al. | 362/244 |
| 6,367,950 B1 | * | 4/2002 | Yamada et al. | 362/245 |
| 7,312,927 B2 | * | 12/2007 | Bogner et al. | 359/630 |
| 7,837,364 B2 | * | 11/2010 | Budinger et al. | 362/471 |
| 7,997,762 B2 | * | 8/2011 | Wang et al. | 362/249.02 |
| 8,049,237 B2 | * | 11/2011 | Yamada et al. | 257/98 |
| 8,061,876 B2 | * | 11/2011 | Oide et al. | 362/297 |
| 8,427,048 B2 | * | 4/2013 | Konishi et al. | 313/505 |
| 2006/0007553 A1 | | 1/2006 | Bogner et al. | |
| 2009/0010014 A1 | | 1/2009 | Budinger et al. | |
| 2010/0046221 A1 | * | 2/2010 | Posselt et al. | 362/249.02 |

FOREIGN PATENT DOCUMENTS

| | | | |
|---|---|---|---|
| CN | 201122598 | 9/2008 | |
| CN | 100426503 | 10/2008 | |
| EP | 2 056 016 | 5/2009 | |
| JP | 2004-265649 | 9/2004 | |
| JP | 2010-129501 | 6/2010 | |
| WO | WO2008023797 | * 2/2008 | 362/297 |

* cited by examiner

*Primary Examiner* — Peggy A. Neils
(74) *Attorney, Agent, or Firm* — Morrison & Foerster LLP

(57) ABSTRACT

There is provided a lighting system capable of suppressing a decrease in light output while preventing occurrence of glare. The lighting system of the present invention includes a light-emitting device and a jig for light control. The light-emitting device includes a plurality of light-emitting elements arranged so as to be distributed on a substrate, and the jig for light control is made up of a resin plate having a plurality of discrete openings for light-emitting surface partitioned by a louver. The light-emitting device and the jig for light control are overlaid so that a light-emitting portion is exposed from the plurality of discrete openings for light-emitting surface.

20 Claims, 14 Drawing Sheets

LIGHTING SYSTEM

CROSS REFERENCE TO RELATED APPLICATION

This Nonprovisional application claims priority under 35 U.S.C. §119(a) on Patent Application No. 2010-241486 filed in Japan on Oct. 27, 2010 the entire contents of which are hereby incorporated by reference.

BACKGROUND OF THE INVENTION

1. Field of the Invention

The present invention relates to a lighting system, and particularly to a lighting system including a light-emitting device having light-emitting elements such as LEDs.

2. Description of the Related Art

Conventionally, there has been provided a light-emitting device with light-emitting elements mounted thereon. Particularly, when LED light sources are used as the light-emitting elements, anti-glare measures are important because directivity of light is high due to a structure thereof.

In Japanese Patent Application Laid-Open No. 2004-265649 (hereinafter, referred to as publicly-known literature 1), and in Japanese Patent Application Laid-Open No. 2010-129501 (hereinafter, referred to as publicly-known literature 2), there are disclosed lighting systems that take anti-glare measures.

FIG. 13 is a schematic structure diagram of the lighting system disclosed in publicly-known literature 1. A lighting system 100 is structured so as to be held by T-shaped bars attached to a ceiling surface in a grating shape to be used, and includes a lighting equipment body 101 and a louver 105. Inside the lighting equipment body 101, a rectangular-shaped fluorescent lamp 103 is detachably placed.

The louver 105 has a plurality of louver vanes 107 arrayed in a direction perpendicular to straight tube portions of the fluorescent lamp placed along an rectangular-shaped opening formed in the lighting equipment body 101. This can prevent glare and reflection of the fluorescent lamp on a screen of a display device, and in addition, an amount of light blocked by this louver 105 is suppressed to be smaller, which maintains illuminance.

FIG. 14 is a schematic structure diagram of the lighting system disclosed in publicly-known literature 2. A lighting system 110 is provided with a flat plate-like light-emitting unit 112 having light-emitting elements 111 made up of a plurality of LEDs, and reflectors 115 to reflect light of these light-emitting elements 111. Moreover, a light control member 117 to control outgoing light from the light-emitting unit 112 and a cover member 113 are included.

The light control member 117 is provided along an inner circumference of a light-shielding wall 119 of a body so as to cover the light-shielding wall 119, and is made of a member that reflects the outgoing light of the light-emitting unit 112. In order that the light becomes close to light distribution of an incandescent bulb, the light control member 117 is made of a reflective plate that brings about wide-angle light distribution.

The technique of publicly-known literature 1 relates to the lighting system having the fluorescent lamp, in which an effect cannot be obtained when it is applied to a lighting system of a type that includes light-emitting elements such as LEDs to irradiate light through a transparent cover.

In the case of the technique of publicly-known literature 2, after reflecting the light radiated from the light-emitting elements 111 at the reflectors 115, the light is further reflected at the light control member 117 to thereby take the anti-glare measures. That is, since the light radiated from the elements needs to be reflected in two stages, there is a problem of inefficiency.

Furthermore, since this light control member 117 is made of a metal material because of the need to reflect the light. In publicly-known literature 2, this is realized by depositing aluminum on a surface of PBT to apply mirror-surface finish. In this manner, when the metal material is used for the light control member 117, there is a problem that the material deteriorates over time, thereby decreasing reflection efficiency. That is, secular usage gives rise to fears that light different from the desired light distribution is radiated.

SUMMARY OF THE INVENTION

In light of the aforementioned problems, an object of the present invention is to provide a lighting system capable of suppressing a decrease in light output while preventing occurrence of glare.

A lighting system of the present invention made in order to achieve the above-described object includes a light-emitting device and a jig for light control, and is characterized in that the light-emitting device includes a plurality of light-emitting elements arranged so as to be distributed on a substrate, the jig for light control is made up of a resin plate having a plurality of discrete openings for light-emitting surface partitioned by a louver, and the light-emitting device and the jig for light control are overlaid so that the plurality of light-emitting elements are exposed from the plurality of discrete openings for light-emitting surface.

At this time, it is preferable that the louver is formed with an incline in side surfaces of each of the discrete openings for light-emitting surface.

Moreover, it is preferable that the louver is formed so as to make the incline larger at a position farther from a central position.

In addition to the above-described characteristics, as another characteristic, in the lighting system of the present invention, the plurality of light-emitting elements are covered with a sealing body, and the louver is arranged in a state where a bottommost surface thereof is vertically spaced from a topmost surface of the sealing body.

It is preferable that the louver is formed into a grating shape when seen from a top surface.

As another characteristic, in the present lighting system, the plurality of light-emitting elements are connected in series in a predetermined first direction to form a series circuit, and the series circuits are plurally arrayed in parallel in a second direction perpendicular to the first direction, and that the louver is arranged so that the number of bars thereof crossing the first direction is larger than that of bars crossing the second direction.

As another characteristic, the louver forms a circular ring shape made of concentric circles or a part of the concentric circles when seen from above.

As another characteristic, the louver is constructed so that the plurality of partitioned discrete openings for light-emitting surface form a honeycomb shape.

In addition to the above-described characteristics, as another characteristic, in the present lighting system, the louver is constructed to be detachable from the jig for light control.

As another characteristic, in the present lighting system, the light-emitting device has, on the substrate, electrode lands for connector connection for external connection electrically connected to the plurality of light-emitting elements, the jig for light control has, on the resin plate, openings for connector terminals into which connector terminals are inserted, and the light-emitting device and the jig for light control are overlaid so that the electrode lands for connector connection and the openings for connector terminals are opposed.

As another characteristic, in the present lighting system, the light-emitting device and the jig for light control are covered with a transparent cover member, and light radiated from the plurality of light-emitting elements is guided outside the system through the plurality of discrete openings for light-emitting surface provided in the jig for light control, and the cover member.

According to the lighting system of the present invention, since the existence of the louver allows the light radiated from the plurality of light-emitting elements to be diffused, reflection in a plurality of states need not be performed, and light loss can be suppressed to be smaller than that in the conventional constitution. This can reduce the number of light-emitting elements to be mounted and a drive current, and suppress power consumption and an amount of heat generation, as compared with the conventional constitution.

In the case of the constitution of the present lighting system, since the light radiated from the plurality of light-emitting elements is diffused, the problem of glare does not come up to the surface even when the transparent cover member (lens dome) is mounted. Making the cover transparent allows a larger amount of light to be taken outside the lighting system, which can realize the highly-efficient lighting system.

DESCRIPTION OF THE PREFERRED EMBODIMENTS

Figure 1A:
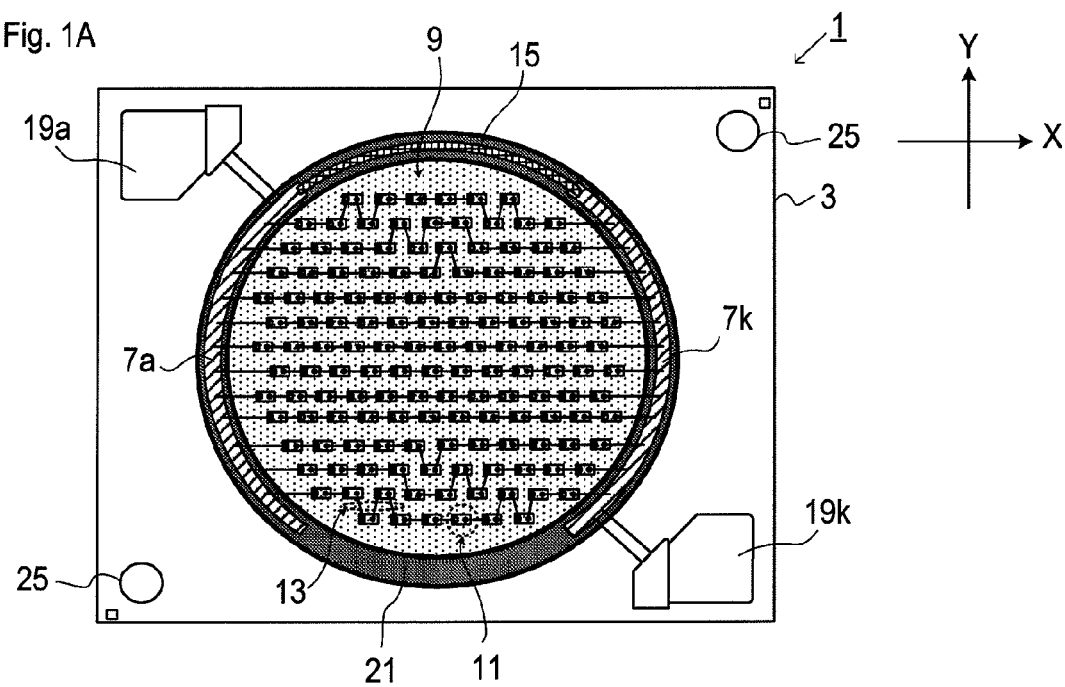
FIGS. 1A and 1B are schematic structure diagrams of a light-emitting device and a jig for light control included by a lighting system of the present invention.
Figure 1B:
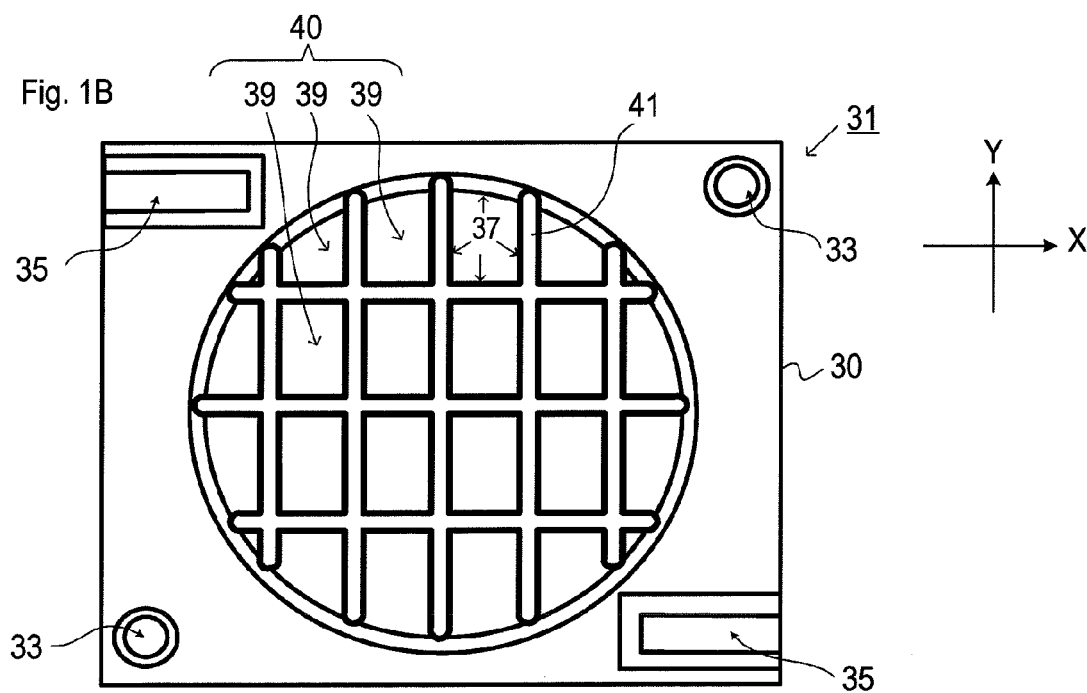

FIGS. 1A and 1B are schematic structure diagrams showing an example of a light-emitting device and a jig for light control included in a light system of the present embodiment. FIG. 1A shows the light-emitting device, and FIG. 1B shows the jig for light control.

As shown in FIG. 1A, a light-emitting device 1 included in the present lighting system includes a ceramic substrate 3, wiring patterns 7 (7a, 7k), a phosphor-containing resin layer 9, LED chips 11, wires 13, a printing resistive element 15, electrode lands for connector connection 19 (19a, 19k), a resin dam 21, and light-emitting device fixing holes 25 used at the time of positioning. In FIG. 1A, in order to make connection relations clear, an inside is made transparent to be shown.

Moreover, as shown in FIG. 1B, a jig for light control 31 included by the present lighting system is a jig to control radiated light from the LED chips 11 by being overlaid on the light-emitting device 1, and is made up of a resin plate 30 having almost the same size as that of the ceramic substrate 3. In the resin plate 30, jig-for-light-control fixing holes 33 used at the time of positioning, openings for connector terminals 35, and opening for light-emitting surface 40 are formed.

First, the light-emitting device 1 shown in FIG. 1A is described.

The wiring pattern 7a and the electrode land 19a are both electrically connected to an anode terminal, and the wiring pattern 7k and the electrode land 19k are both electrically connected to a cathode terminal.

The ceramic substrate 3 is formed into a rectangular shape. As one example, an outer shape is 24 mm×20 mm, and a thickness is 1 mm.

The electrode land 19a for anode connection and the electrode land 19k for cathode connection are arranged in corner portions diagonally opposed to each other in the ceramic substrate 3, respectively.

The electrode lands for connector connection 19a and 19k are electrodes used when external connection (e.g., for power supply application) to the wiring patterns 7 is formed through a connector. The electrode lands for connector connection 19a and 19k are made of Au, and are formed by a screen printing method. An example of a thickness is 3 µm.

Au used as the material of the electrode lands for connector connection 19a and 19k is characterized in that an oxide film is hardly formed on a surface thereof. This allows the electric connection to the outside to be easily assured by connector contact.

While it is preferable that Au (a layer thereof) is formed on outermost surfaces of the electrode lands for connector connection 19a and 19k so as to easily obtain the conduction at the time of connector contact, a hard metal layer (Ti, W or the like) having a lower specific resistance may be formed thinly in order to prevent damage at the time of connector contact. In place of Au (the layer thereof), a hard metal that is difficult to oxidize and has a lower specific resistance can also be used.

The wiring patterns 7a and 7k are formed on the ceramic substrate 3 so as to be opposed to each other. Each of them is formed into a circular arc shape partially cut out from a circular ring when seen from a top surface of the light-emitting device 1. The electrode land for connector connection 19a is connected to one end of the wiring pattern 7a through leading wiring, and the electrode land for connector connection 19k is connected to one end of the wiring pattern 7k through leading wiring.

The printing resistive element 15 is provided for the purpose of increasing electrostatic withstand voltage, and as one example, is formed of $RhO_2$ having a length of 200 μm, a width of 6 μm, and a resistance value of 50 MΩ. The printing resistive element 15 is arranged so as to be connected to the one end of the wiring pattern 7a and the other end of the wiring pattern 7k, and is formed into a circular arc shape partially cut out from the circular ring. In the present embodiment, each of the wiring pattern 7a, the printing resistive element 15, and the wiring pattern 7k is arranged so as to make up a part of an outer circumference of the same circular ring.

On the ceramic substrate 3, the plurality of LED chips 11 are installed. In the present embodiment, series circuits made up of the 12 LED chips 11 are connected in parallel in 12 rows. In FIGS. 1A and 1B, a direction in which these series circuits are adjacent to each other is a Y direction, and a direction perpendicular to the Y direction is an X direction.

The LED chips 11 are linearly arranged in a plurality of rows so as to be almost parallel to a side of the substrate (in the X direction). In order to arrange the LED chips 11 in high density in an area surrounded by the wiring patterns 7, a number of the chips in the row near a center of the circular ring shape formed of the wiring patterns 7 and the printing resistive element 15 is made largest, and the number of chips in the row is made smaller toward a circumference of the substrate from the center.

In the case of the above-described arrangement, when seen from the top surface of the light-emitting device 1, an outer shape of an aggregate of the array of the LED chips 11 is almost the same as (or similar to) an outer shape of the phosphor-containing resin layer 9 (a sealing body). In the present embodiment, as shown in FIGS. 1A and 1B, the shape of the sealing body seen from the top surface is circular, and the outer shape of the aggregate of the array of the LED chips 11 is also circular. By this constitution, a defect that shadow is caused due to absence of the arrangement of the light sources in the circumference of the sealing body and that a light-emitting pattern in the same shape as that of the sealing body cannot be obtained can be avoided.

Basically, in one LED chip row, the adjacent LED chips 11 are directly electrically connected by the wire 13. However, in order to equalize the number of the LED chips 11 that each of the series circuits has, there are portions where electric connection is made between the LED chips in the adjacent rows near the circumference of the substrate, where the number of chips existing in the same row is smaller. Moreover, the LED chips 11 arranged in the vicinity of the wiring patterns 7 are electrically connected directly to the wiring patterns 7 by the wires.

The resin dam 21 is a resin to dam sealing resin, and is made of a colored material (preferably, white or milky white). In the present embodiment, the resin dam 21 is formed of white silicon resin (containing a filler $TiO_2$) into a circular ring with a width 1 mm and a diameter 9 mm. In the formation, the resin is poured, and then, cure treatment is performed at 150° C. for 60 minutes. The resin dam 21 is preferably formed so as to partially cover the wiring patterns 7, the printing resistive element 15, and the wires 13, as shown in FIG. 1A.

The phosphor-containing resin layer 9 is formed to convert the light radiated from the LED chips (e.g., blue light) to white light. In the present embodiment, a material containing green phosphor (e.g., $Ca_3(Sr.Mg)_2Si_3O_{12}$:Ce) and red phosphor (e.g., $(Sr.Ca)AlSiN_3$:Eu) is injected into an inside of the resin dam 21 formed into a ring, and is thermally-cured at 150° C. for 5 hours to thereby form the phosphor-containing resin layer 9.

In the present embodiment, as shown in FIG. 1A, the light-emitting device fixing holes 25 for positioning are provided at two portions in the corner portions diagonally opposed to each other in the ceramic substrate 3. These light-emitting device fixing holes 25 are used for screw clamping when the jig for light control 31 is fixed to the light-emitting device 1.

Next, the jig for light control 31 shown in FIG. 1B is described.

The opening for light-emitting surface 40 has an outer edge constructed in an almost circle, and is divided into a plurality of discrete openings for light-emitting surface 39 by forming a louver 41 constructed in a mesh shape inside. Moreover, inclined portions 37 are formed in outer surfaces of each of the plurality of discrete openings for light-emitting surface 39 to assume a role of a reflective member.

Bars of the louver 41 are plurally extended in the X direction and in the Y direction with a predetermined width, and cross one another in the X and Y directions to thereby form frames of the small window-type discrete openings for light-emitting surface 39. The opening for light-emitting surface 40 is divided by this louver 41 into the plurality of discrete openings for light-emitting surface 39 like small windows.

In the example of FIG. 1B, the five bars of the louver 41 are arranged in the X direction and the three bars of the louver 41 are arranged in the Y direction. In this manner, it is preferable that the more bars of the louver 41 are arranged in the X direction than in the Y direction. This is because the plurality of LED chips 11 are connected in series in the X direction as shown in FIG. 1A, and thus, the intensity of light is higher in the X direction than in the Y direction. The number of the bars of the louver crossing the X direction, which is a direction with the higher light intensity, (the number of the bars of the louver arranged in the X direction) is made larger, and the number of the bars of the louver crossing the Y direction with the lower light intensity (the number of bars arranged in the Y direction) is made smaller, by which a decrease in light emission intensity accompanying the existence of the louver 41 can be suppressed.

The resin plate 30 and the louver 41 making up the jig for light control 31 are formed of PBT (polybutylene terephthalate) resin, PC (polycarbonate) resin or the like. In the present embodiment, as one example, milky white or white PBT resin having a high reflectance to the radiated light from the light-emitting portion is employed.

As shown in FIG. 1B, the jig-for-light-control fixing holes 33 are provided in the two opposed corner portions on one of diagonal lines of the jig for light control 31, the openings for connector terminals 35 are provided in the two opposed corner portions on the other diagonal line. The openings for connector terminals 35 are constructed so that the connector can be inserted into the inside of the resin plate 30 from side surface portions of the resin plate 30.

Figure 2:
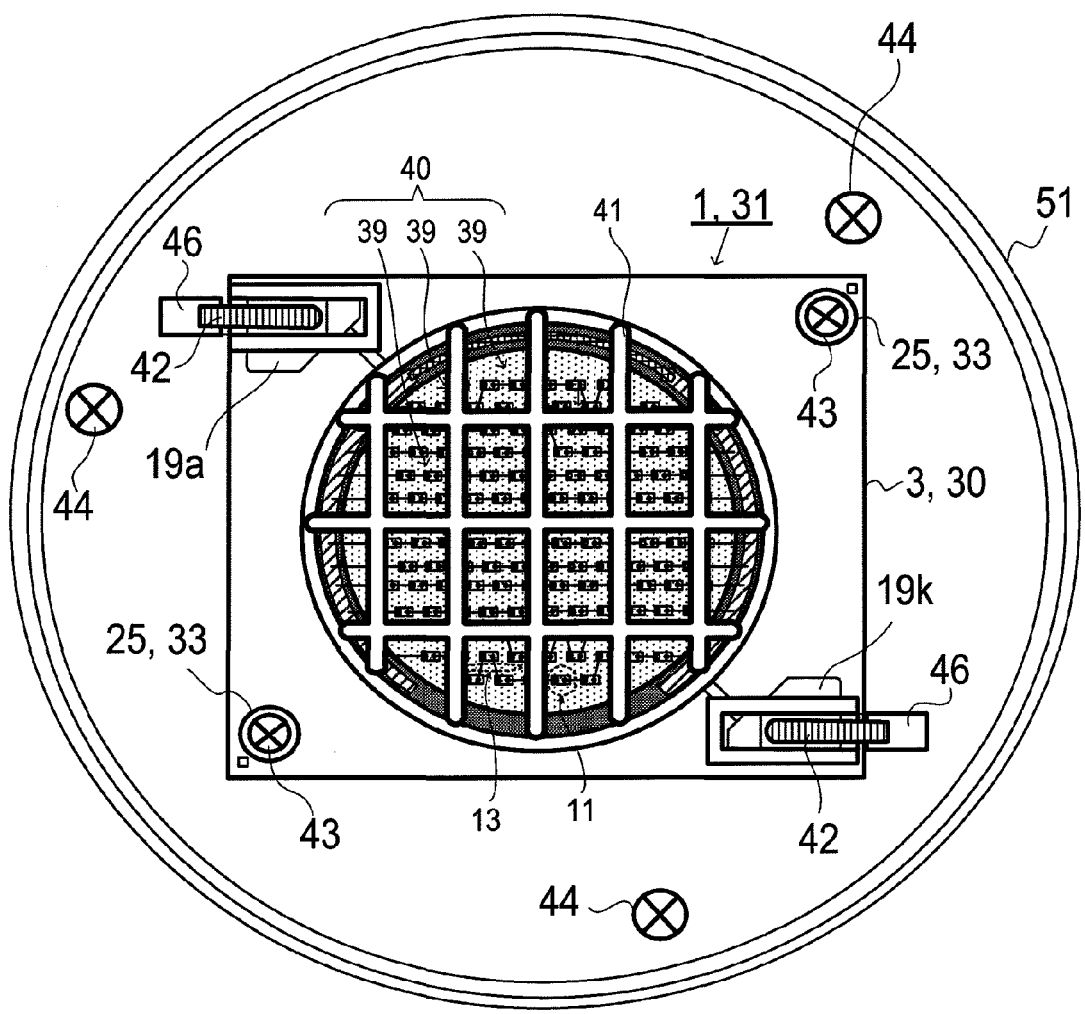
FIG. 2 is a schematic structure diagram showing a state where the light-emitting device and the jig for light control are overlaid and fixed to a case portion.

FIG. 2 is a schematic structure diagram showing a state where the light-emitting device 1 and the jig for light control 31 are overlaid and fixed to a case part.

As shown in FIG. 2, overlaying the light-emitting device 1 and the jig for light control 31 allows the light-emitting device fixing holes 25 provided in the ceramic substrate 3 of the light-emitting device 1, and the jig-for-light-control fixing holes 33 provided in the jig for light control 31 to be overlaid. Moreover, the light-emitting surface including the LED chips 11 and the phosphor-containing resin layer 9 is exposed from the plurality of small window-like discrete openings for light-emitting surface with the louver 41 used as outer frames (the opening for light-emitting surface 40).

Furthermore, a part of each of the electrode lands for the connector connection 19a and 19k provided in the light-emitting device 1 and each of the openings for connector terminals 35 provided in the jig for light control 31 are vertically opposed to one another. In FIG. 2, in order to make it clear that the electrode lands 19a and 19k exist under the openings for connector terminals 35, the resin plate 30 placed above the electrode lands 19a and 19k is made transparent to be shown.

Figure 3:
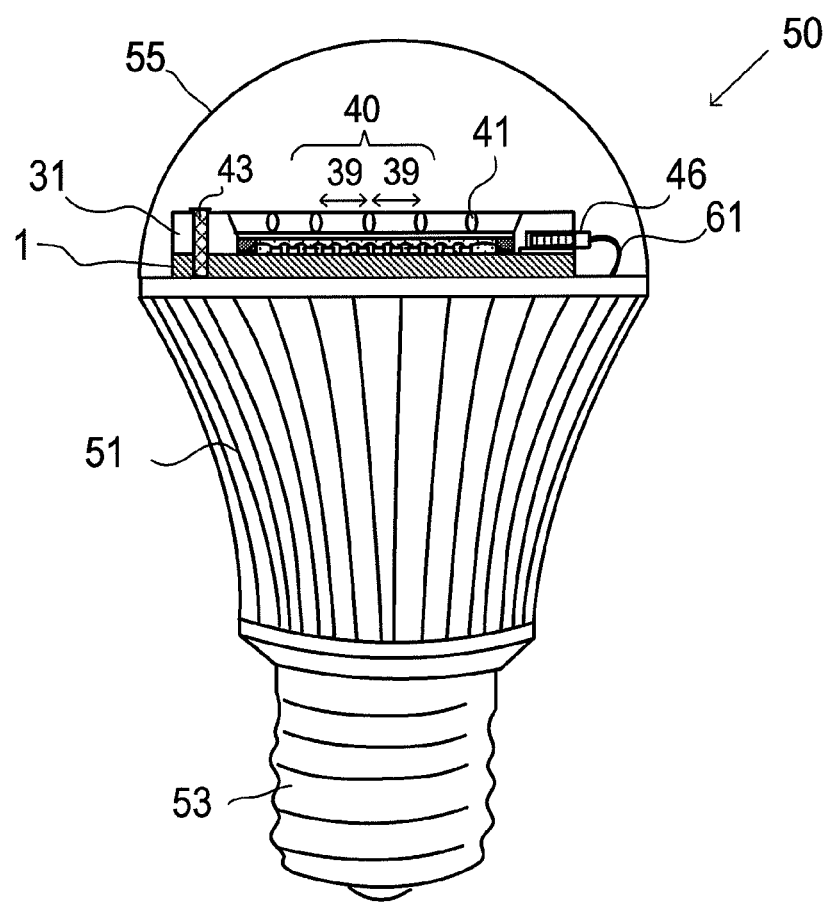
FIG. 3 is an appearance diagram of the lighting system with the light-emitting device and the jig for light control mounted thereon.

In this manner, the jig for light control 31 is set to fit the connector 46 in the openings for connector terminals 35, by which the electric connection between leads (leads in the connector) 42 attached to the connector and the electrode lands for connector connection 19a and 19k is formed. Screws 43 (e.g., M5 screws) are fitted so as to penetrate the light-emitting device fixing holes 25 and the jig-for-light-control fixing holes 33 to fix the jig for light control 31 and the light-emitting device 1 to a case part 51. Then, by fitting a lens dome 55, an LED lighting system 50 is formed (refer to FIG. 3). In FIG. 3, reference numeral 53 denotes a cap, which may be integrated with the case part 51. Reference numeral 61 denotes a lead.

Figure 4A:
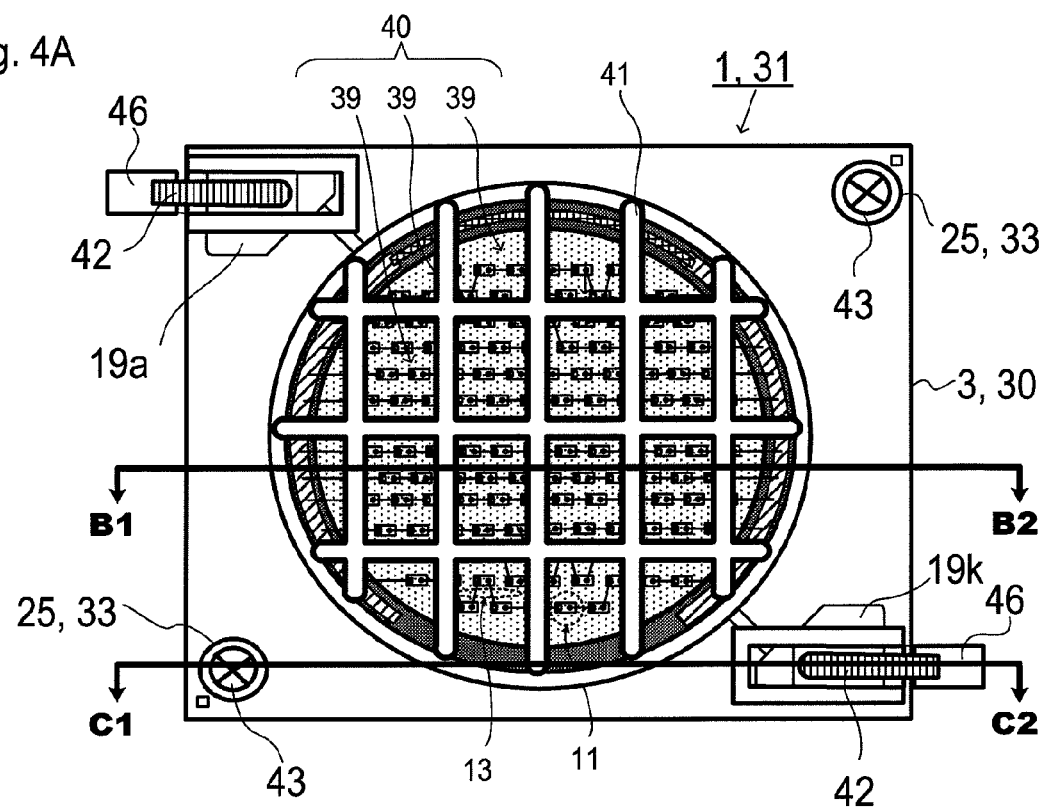
FIGS. 4A to 4C are schematic structure diagrams showing a state where the light-emitting device and the jig for light control are overlaid.
Figure 4B:
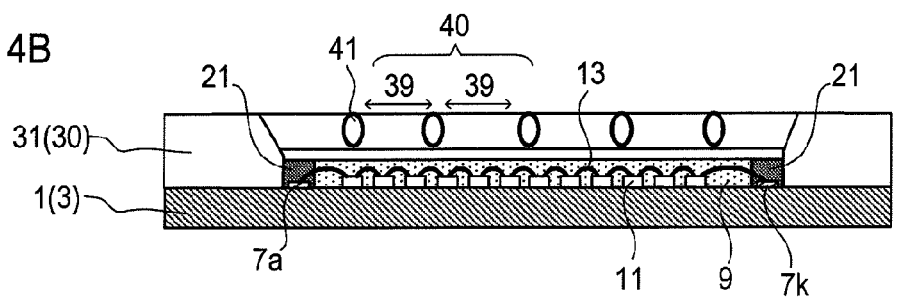
Figure 4C:
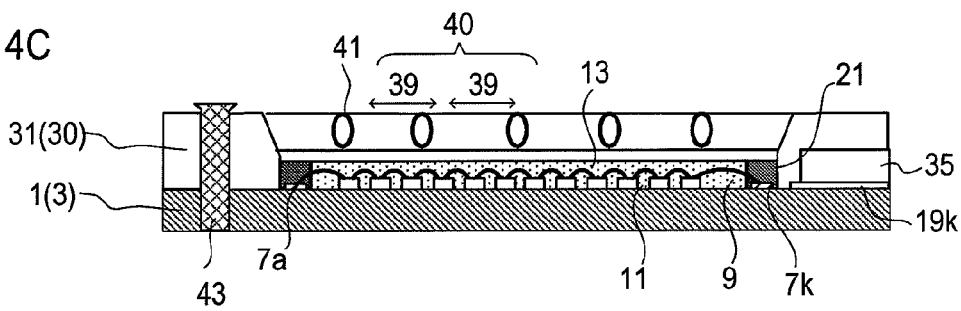

A more detailed description of a structure of the jig for light control 31 is given. FIGS. 4A to 4C are conceptual diagrams of a top surface and cross sections at a point when the resin plate 30 of the jig for light control 31 and the ceramic substrate 3 of the light-emitting device 1 are overlaid. FIG. 4A is a top diagram, FIG. 4B is a cross-sectional diagram along B1-B2 in FIG. 4A, and FIG. 4C is a cross-sectional diagram along C1-C2 in FIG. 4A. The illustration of the case part 51 shown in FIG. 2 is omitted.

As described above, the jig for light control 31 is overlaid on the ceramic substrate 3, which allows the light-emitting surface including the LED chips 11 and the phosphor-containing resin layer 9 to be exposed from the small window-like discrete openings for light-emitting surface 39 partitioned by the louver 41.

Here, as shown in FIGS. 4B and 4C, in the present embodiment, a lower end of the louver 41 is arranged in a state vertically spaced from a top surface of the phosphor-containing resin layer 9 on the ceramic substrate 3. The arrangement with a given space allows the light emission (pattern) from the light-emitting device 1 to be diffused more, and can further increase the reduction action of glare.

Figure 5A:
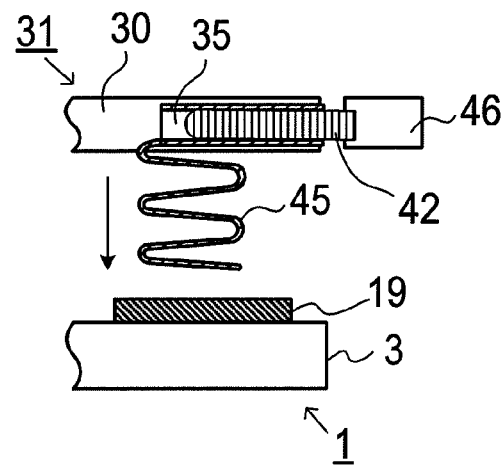
FIGS. 5A and 5B are diagrams for describing a method for assuring electric connection between electrode lands for connector connection and the jig for light control.
Figure 5B:
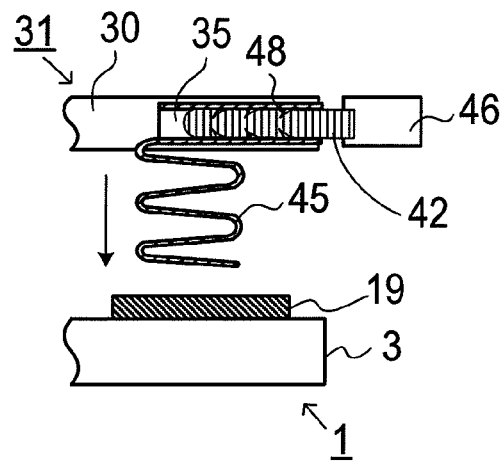

FIGS. 5A and 5B are conceptual diagrams for describing a method for assuring the electric connection between the electrode lands for connector connection 19 and the jig for light control 31 when the resin plate 30 of the jig for light control 31 and the ceramic substrate 3 of the light-emitting device 1 are overlaid. In FIGS. 5A and 5B, reference numeral 45 denotes a lead attached to the jig.

As described before, the light-emitting device 1 and the jig for light control 31 are overlaid so that the light-emitting device fixing holes 25 provided on the ceramic substrate 3 and the jig-for-light-control fixing holes 33 provided on the resin plate 30 overlap, by which the openings for connector terminals 35 provided in the jig for light control 31 and the electrode lands for connector connection 19 have a positional relationship of being vertically opposed to one another. In the jig for light control 31, the leads 45 attached to the jig 31 to form the electric connection between the leads in the connector 42 and the electrode lands for connector connection 19 are provided.

As shown in FIG. 5A, the leads 45 attached to the jig 31 are each formed of a conductive material wound like a spring. The spring shape is to expand a contact area between the leads 45 attached to the jig 31 and the electrode lands for connector connection 19 to thereby distribute a force applied at the time of contact lest tip ends of the leads 45 attached to the jig 31 come into sharp contact with surfaces of the electrode lands for connector connection 19, thereby damaging the surfaces when the jig for light control 31 and the light-emitting device 1 are overlaid. As described above, since in fixing the jig for light control 31 and the light-emitting device 1 to the case part 51, the screws 43 are fitted so as to penetrate the light-emitting device fixing holes 25 and the jig-for-light-control fixing holes 33, this screw tightening makes complete the electric connection between the leads 45 attached to jig 31 and the electrode lands for connector connection 19.

As shown in FIG. 5B, it is also preferable that in order to prevent the connector 46 inserted into the openings for connector terminals 35 from easily coming off, claw portions 48 are formed inside each of the openings for connector terminals 35 in advance.

Next, effects of the lighting system in the present embodiment are described. Table 1 is to describe the effects of the lighting system of the present embodiment. A light flux amount of the lighting system of the present embodiment and a light flux amount of a conventional LED lighting system when a total light flux amount in the case where the light-emitting device 1 is included alone is 100 are indicated. In Table 1, values of full-width at half-maximum in the respective cases are indicated as well.

TABLE 1

|  | Light-emitting device alone | Lighting system of the present embodiment | Conventional LED lighting system |
| --- | --- | --- | --- |
| Total light flux | 100 | 92 | 87 |
| Full-width at half-maximum | 120 | 145 | 145 |

The value of full-width at half-maximum in the lighting system of the present embodiment is larger than that of the constitution in which the light-emitting device is included alone. From this, it is found that including the jig for light control 31 makes the wavelength of the radiated light broader, thereby forming light close to white, which brings about the effect of alleviating glare. This is realized by the jig for light control 31 including the louver 41 to thereby diffuse the light radiated from the light-emitting portion and increase a light distribution angle.

As for the total light flux, it is found that reduction in light flux amount is suppressed in the lighting system of the present embodiment more than in the conventional LED lighting system. This reveals that the alleviation of glare can be realized while the decrease in luminance efficiency is suppressed.

In the conventional LED lighting system, since the light radiated from the individual LED elements is not diffused, a bulb cover needs to have a function of diffusing the light, and in this case, loss of 10% or more occurs in an amount of light actually radiated outside the lighting system with respect to an amount of light radiated from the LED elements. Thus, in order to compensate for this loss, measures of increasing the number of the LED elements to be mounted, or increasing a drive current are needed. However, when such measures are taken, there arises a problem that power consumption and an amount of heat generation are increased.

According to the constitution of the present embodiment, since the radiated light from the LED elements is diffused due to the existence of the louver 41, the loss of the light can be suppressed to be smaller than that in the conventional constitution. This can make the number of the LED elements to be mounted smaller and the drive current smaller than those in conventional constitution, and can suppress the power consumption and the amount of heat generation. Moreover, unlike the technique of publicly-known literature 2, the light need not be reflected in two stages.

In the case of the constitution of the present embodiment, since the radiated light from the LED elements is diffused, even when the transparent cover member (lens dome 55) is mounted, the problem of glare does not come up to the surface. Since by making the cover transparent, a larger light amount can be taken outside the lighting system, the highly-efficient lighting system can be realized.

Normally, a phosphor layer (corresponding to the phosphor-containing resin layer 9 in the present embodiment) is provided inside the LED lighting system, and this phosphor layer is yellowish in appearance. Thereby, when the transparent cover member is mounted, the inside of the lighting system looks yellow. The LED lighting system is often used outdoors, and if the inside of the lighting system looks yellow in this manner, a user may feel uncomfortable.

However, in the lighting system of the present invention, since the jig for light control 31 is provided above the phosphor-containing resin layer 9, the constitution is not such that the inside of the lighting system can be completely visually recognized by the user. While the constitution is such that the phosphor-containing resin layer 9 can be visually recognized through the small window-like discrete openings for light-emitting surface 39 formed, using the louver 41 as the outer frames, these discrete openings for light-emitting surface 39 are partitioned by the louver 41, and a size thereof is small, which largely reduces a situation where the user visually recognizes the yellowish phosphor-containing resin layer 9 existing behind the louver 41 without intention. Thereby, the highly-efficient lighting system having the glare suppression effect can be realized without providing an uncomfortable feeling to the user.

Furthermore, according to the lighting system of the present embodiment, in the structure exhibiting a circular shape when seen from the top surface, the LED chips can be arranged in high density, which can contribute to downsizing of the high luminance lighting system in 25 W grade.

When the lighting system of the present embodiment is used, the jig for light control 31 having almost the same size as that of the ceramic substrate 3 with the LED chips 11 mounted thereon is overlaid on the ceramic substrate 3. At this time, since the jig for light control 31 includes the jig-for-light-control fixing holes 33 and the openings for light-emitting surface 40 corresponding to the structure of the ceramic substrate 3, the jig for light control 31 is automatically positioned at the time of overlaying. This allows the light-emitting elements (LED chips 11) mounted on the light-emitting device 1 to be positioned. Moreover, since the jig for light control 31 is made up of the resin plate 30, a protection function for the ceramic substrate 3 with the LED chips 11 mounted thereon is also realized.

Furthermore, by forming the jig for light control 31 of the white or milky white resin plate, light inside the transparent cover such as light returning to the jig for light control 31 side due to refraction at an inner surface of the transparent cover or the like can be again reflected at a surface of the resin plate of the jig for light control, thereby being taken outside the transparent cover. Accordingly, an effect of improving a decrease in luminance as lighting equipment is also exerted.

Modifications

The shape of the jig for light control 31 is not limited to that in FIG. 1B. Hereinafter, referring to FIGS. 6A to 6C and FIG. 7, modifications are described.

Figure 6A:
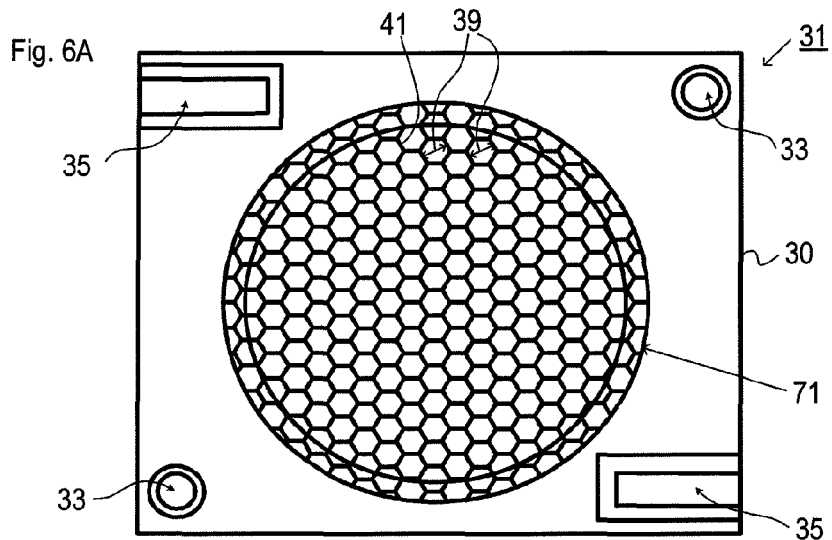
FIGS. 6A to 6C are another schematic structure diagrams of a jig for light control.
Figure 6B:
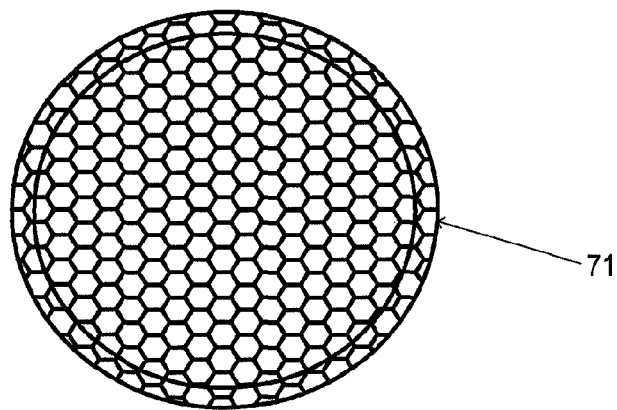

In the jig for light control 31 shown in FIG. 6A, the louver 41 is constructed so that the discrete openings for light-emitting surface 39 form a honeycomb mesh shape. Moreover, as shown in FIG. 6B, this louver 41 can be separated from the jig for light control 31 as a louver part 71. As shown in FIG. 7C, the louver part 71 is fitted in an opening for louver setting 72 provided in the jig for light control 31 or the like to be set, which allows the jig for light control 31 shown in FIG. 6A to be constructed.

This jig for light control 31 is vertically overlaid on the light-emitting device 1 as in FIG. 4A, by which the light emitted by the LED chips 11 is radiated outside the lighting system through the honeycomb discrete openings for light-emitting surface 39.

Figure 6C:
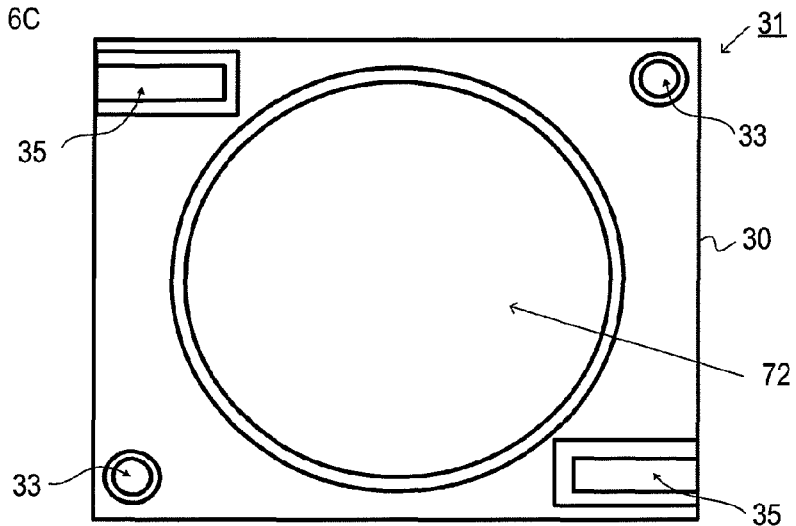

In the structure in FIGS. 6A to 6C, the louver part 71 may be formed integrally with the jig for light control 31 at advance.

Figure 7:
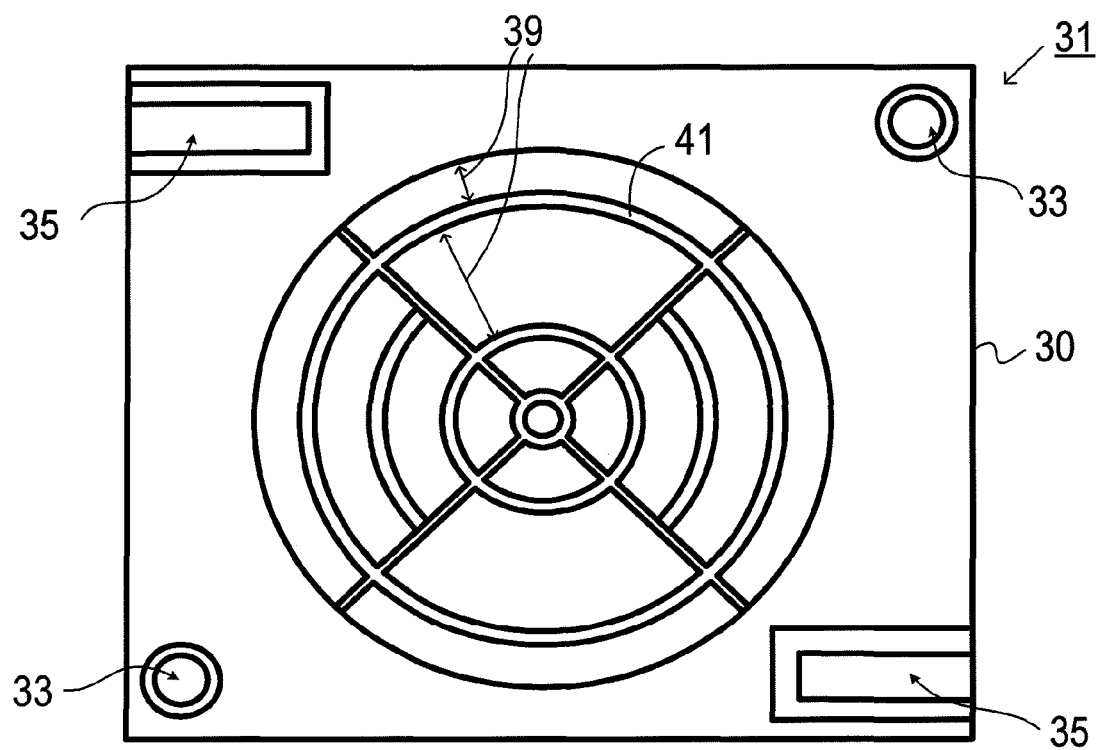
FIG. 7 is still another schematic structure diagram of a jig for light control.

FIG. 7 shows still another structure of the jig for light control 31. In the jig for light control in FIG. 7, the small window-like discrete openings for light-emitting surface 39 formed by the louver 41 is arranged in a concentric fan shape. The structure in FIG. 7 is different from the structure shown in FIG. 1B only in the shapes of the louver 41 and the discrete openings for light-emitting surface 39, and has the same functions.

OTHER EMBODIMENTS

Hereinafter, other embodiments are described.

(1) While in the above-described embodiment, it is assumed that the external connection to the wiring patterns 7 is formed through the connector, the external connection may be formed by soldering.

Figure 8A:
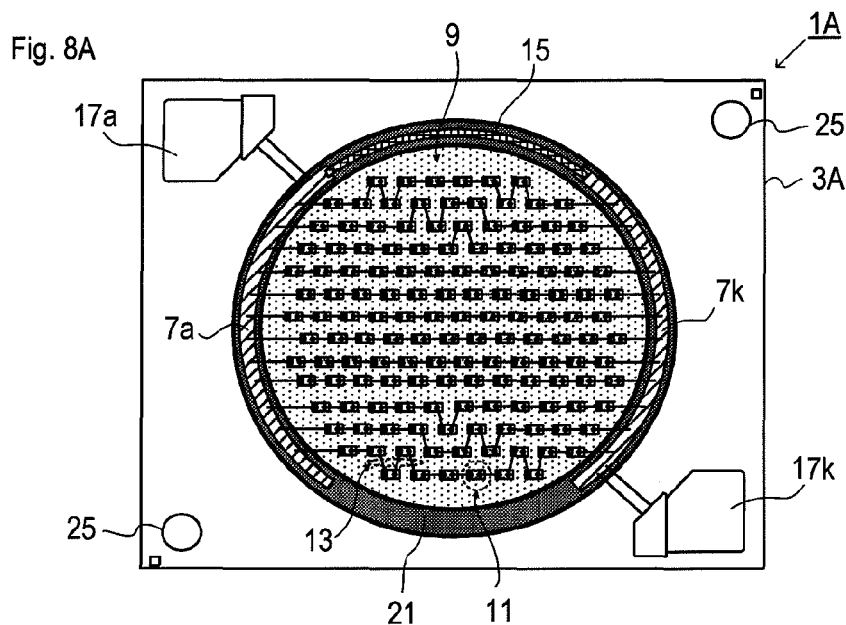
FIGS. 8A and 8B are another schematic structure diagrams of a light-emitting device and a jig for light control included by the lighting system of the present invention.
Figure 8B:
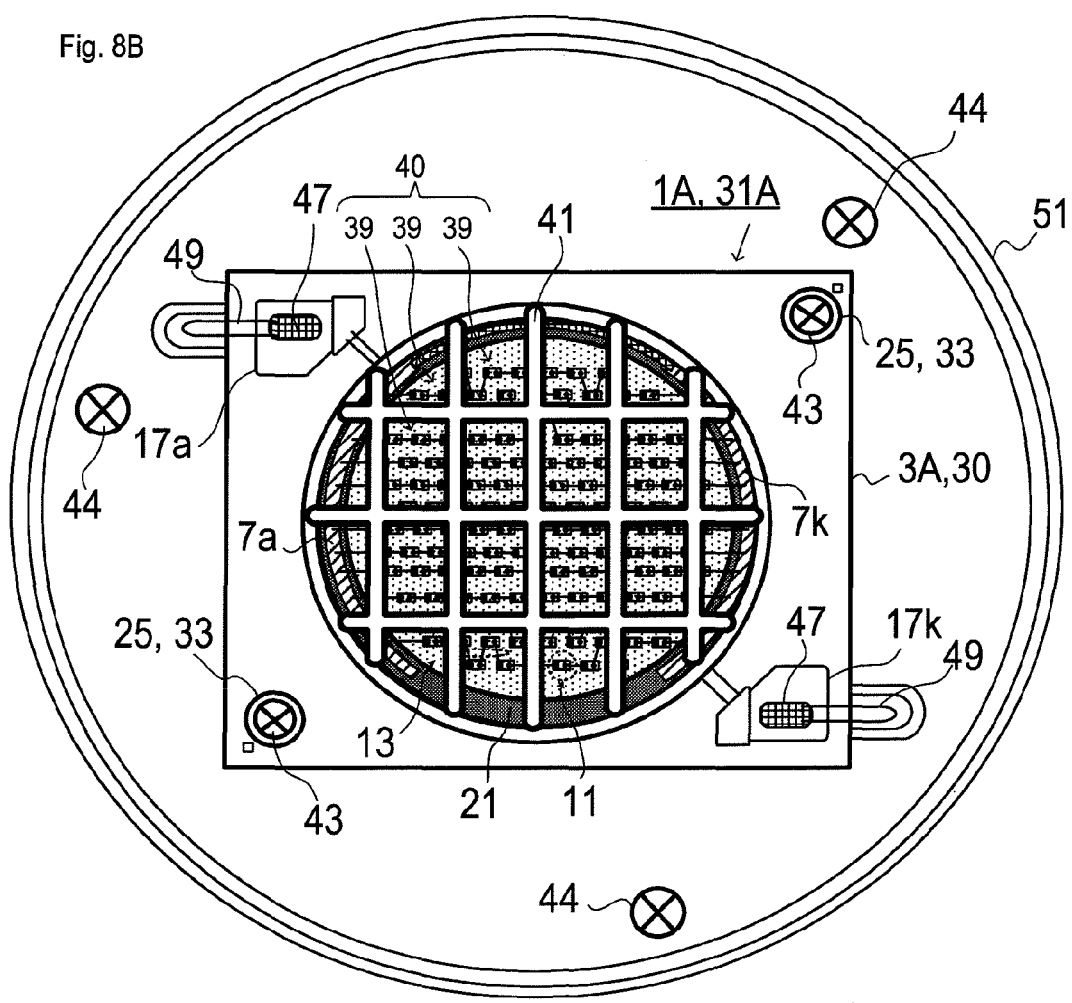

FIGS. 8A and 8B are schematic structure diagrams of a light-emitting device for which the solder connection is assumed, and a lighting system using the same. In FIG. 8B, the lighting system is illustrated with a jig for light control 31A including the louver 41 having the same shape as that in FIG. 1B.

A light-emitting device 1A includes electrode lands for soldering 17 (17a, 17k) on a ceramic substrate 3A in place of the electrode lands for connector connection 19 (19a, 19k).

The electrode lands for soldering 17a, 17k are electrodes used when the external connection with the wiring patterns 7 (e.g., for power supply application) is formed by soldering. They are made of Ag—Pt, and are formed by a screen printing method. One example of a thickness is 20 μm.

While it is preferable that Ag—Pt (a layer thereof) is formed on outermost surfaces of the electrode lands for soldering 17a and 17k, another metal layer may be formed thinly on a surface of Ag—Pt (the layer thereof) because only diffusion reaction to solder in Ag—Pt (the layer thereof) can be prevented. Alternatively, a metal layer having a lower specific resistance may be formed under Ag—Pt (the layer thereof).

As shown in FIG. 8B, when the light-emitting device 1A is connected externally by soldering, soldering is performed to the electrode lands for soldering 17 (17a, 17k), by which the electric connection between external leads 49 and the electrode lands for soldering 17 is formed through solder 47. As in FIG. 2, the jig for light control 31 and the light-emitting device 1 are fixed to the case part 51 by the screws 43 which penetrate the light-emitting device fixing holes 25 and the jig-for-light-control fixing holes 33, and further by screws 44.

When the use of the light-emitting device 1A is assumed, the jig for light control 31A does not need to include the openings for connector terminals 35 as described in FIG. 1B. However, in portions on the back surface side of the resin plate 30 corresponding to the formation positions of the openings for connector terminals 35, depressions to assure spaces for a thickness of the solder and external lead setting and the like may be formed. In FIG. 8B, the resin plate is illustrated transparently so that positions of the electrode lands for soldering 17 (17a, 17k) and the like with respect to jig for light control 31A can be understood.

While Ag—Pt is assumed as the material of the electrode lands for soldering 17, a conductive material having the function of preventing the diffusion to the solder only needs to be contained. As such a material, in addition to the aforementioned Ag—Pt, Ag, Ag—Pd or the like can be used. Moreover, at this time, it is preferable that at least outermost surface portions with which the solder comes into contact are formed of the above-described conductive materials.

Figure 9:
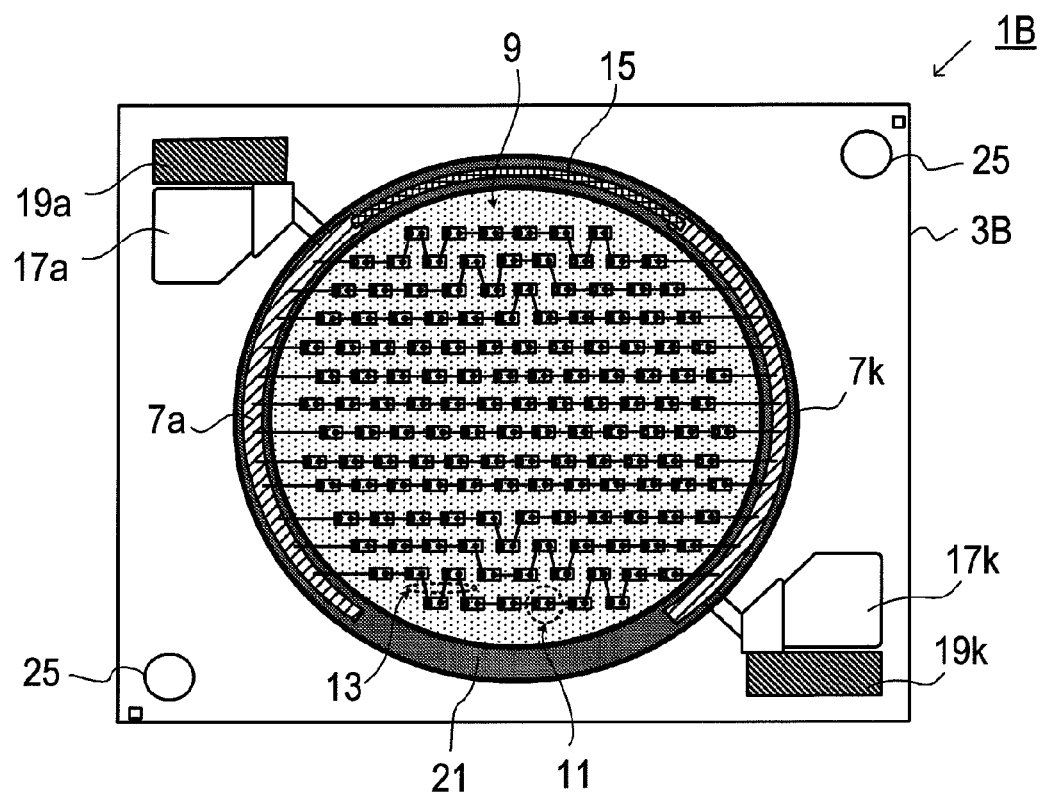
FIG. 9 is still another schematic structure diagram of a light-emitting device included by the lighting system of the present invention.

Moreover, it is preferable that as in a light-emitting device 1B shown in FIG. 9, both the electrode lands for soldering 17 (17a, 17k) and the electrode lands for connector connection 19 (19a, 19k) are mounted on a ceramic substrate 3B to thereby enable both the methods of the soldering and the connector connection to be employed in accordance with a use aspect of the user when the electric connection of the wiring patterns 7 to the outside is assured.

(2) While in the above-described embodiment, the electrode lands 19a and 19k (17a, 17k) are arranged in the corner portions diagonally opposed to each other in the ceramic substrate 3, respectively, the arrangement positions are not limited thereto.

Figure 10A:
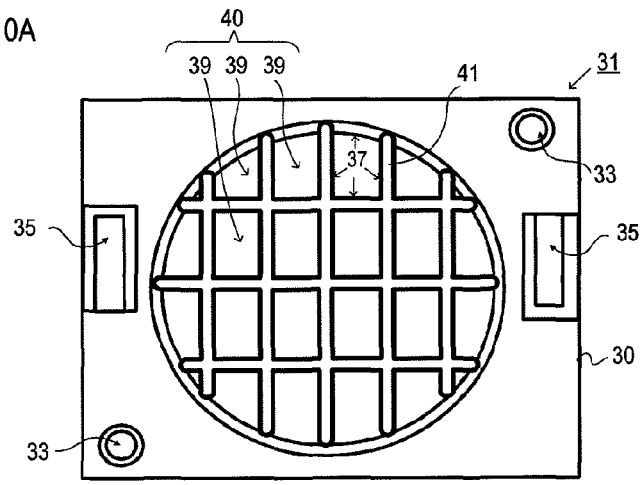
FIGS. 10A to 10C are still another schematic structure diagrams of a light-emitting device and a jig for light control included by the lighting system of the present invention.
Figure 10B:
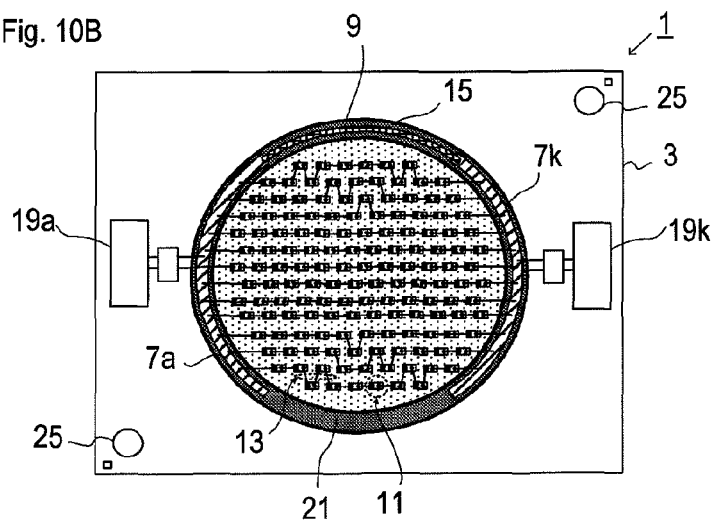
Figure 10C:
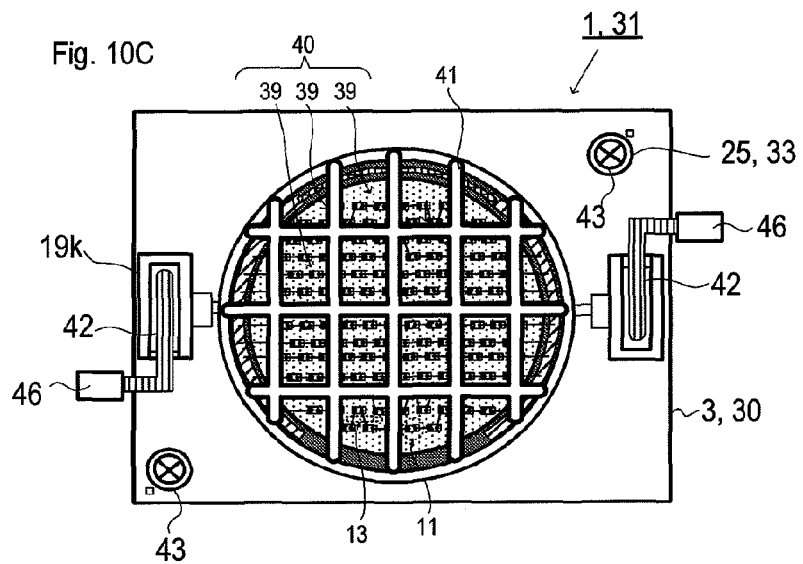

For example, as shown in FIG. 10A, in the jig for light control 31, each of the openings for connector connection 35 is arranged at a position near a center of each of two opposed sides of the resin plate 30. Similarly, as shown in FIG. 10B, in the light-emitting system 1, each of the electrode lands for connector connection 19a and 19k is arranged at a position near a center of each of two opposed sides of the ceramic substrate 3. At this time, vertically overlaying both results in a state shown in FIG. 10C.

In the ceramic substrate 3A including the electrode lands for soldering as well, the electrode lands for soldering can be arranged at similar positions to those in FIG. 10B.

(3) In the above-described embodiment, a cross-sectional shape of the louver 41 can be modified to a rectangle, a trapezoid, a parallelogram or the like in accordance with light distribution characteristics of the light-emitting elements (LED chips) of the light-emitting device 1 as needed. Moreover, a width of the louver 41 and a shape of the discrete openings for light-emitting surface 39 when seen from the top surface can be modified in accordance with the extent of the anti-glare measures.

Moreover, the louver 41 can be formed of a material different from that of the resin plate 30. For example, the louver 41 can be formed of an aluminum material painted with high-reflection white powder.

(4) In the above-described embodiment, the jig for light control 31 includes the openings for connector connection 35 to thereby form the electric connection between the wiring patterns 7 and the outside through these openings 35. That is, the jig for light control 31 is provided with the function of anti-glare measures of the radiated light, and a function of forming electric connection paths from the outside to the wiring patterns and the LED chips.

In contrast, a constitution may be employed in which the jig for light control 31 is used as a jig for anti-glare measures, and in order to form the electric connection paths to the outside, a different jig (jig for connector) is included separately.

Figure 11A:
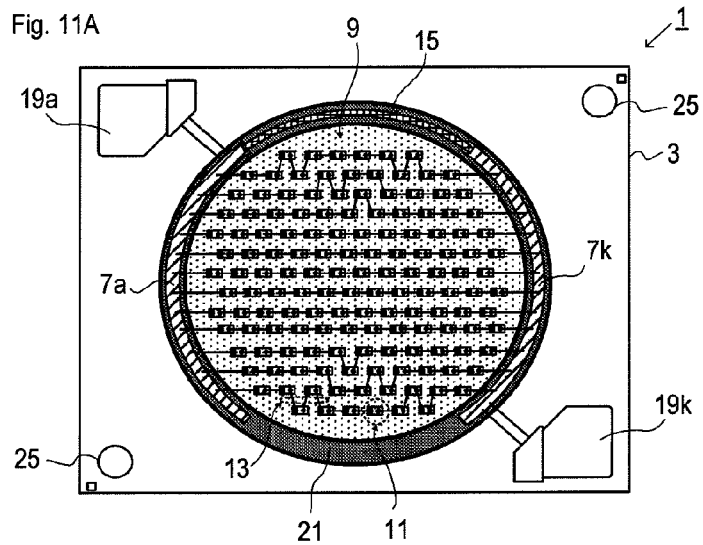
FIGS. 11A to 11C are still another schematic structure diagrams of a light-emitting device and a jig for light control included by the lighting system of the present invention.
Figure 11B:
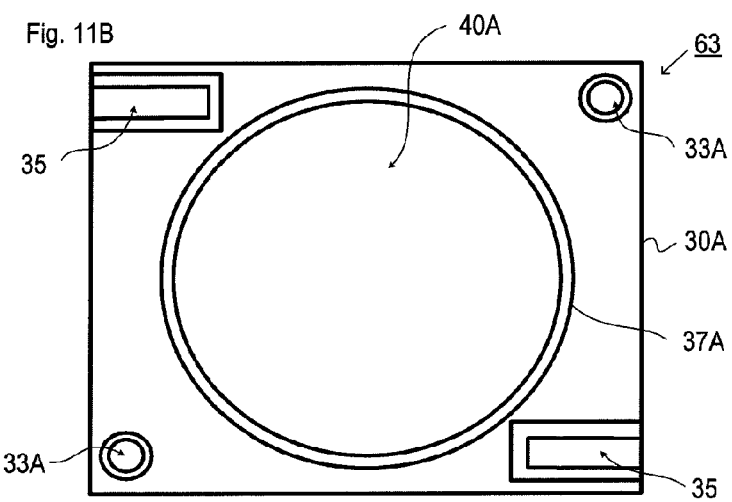
Figure 11C:
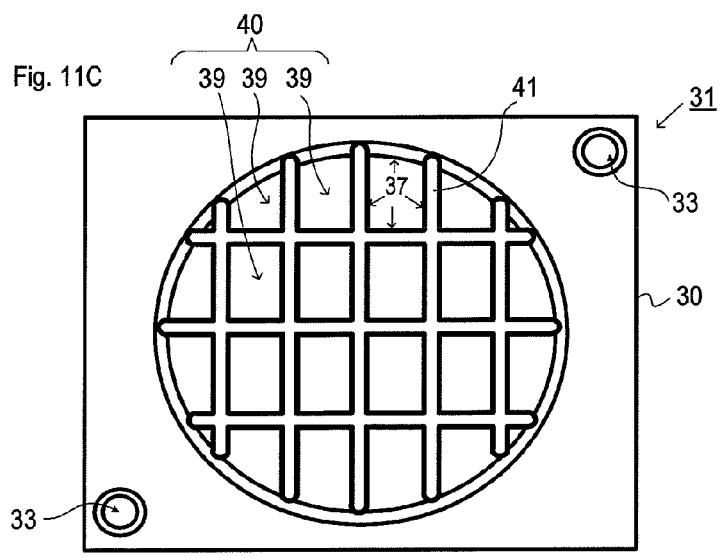

For example, as shown in FIGS. 11A to 11C, a jig for connector 63 with jig-for-connector fixing holes 33A, the openings for connector terminals 35, and an opening for light-emitting surface 40A formed on a resin plate 30A as shown in FIG. 11B is overlaid above the light-emitting device 1 shown in FIG. 11A. The jig for light control 31 shown in FIG. 11C is further overlaid above the above-described assembly. Screws are fitted so as to penetrate the light-emitting device fixing holes 25, the jig-for connector fixing holes 33A, and the jig-for-light-control fixing holes 33 to be fixed.

(5) The lighting system 50 in the above-described embodiment has been described on the assumption that it is covered with the transparent cover (lens dome 55) for the purpose of suppressing a decrease in transmittance of the light. However, obviously, the jig for light control of the present invention can be used in the lighting system in a state covered with an opaque cover, the contents of which are within the scope of the present invention.

(6) A constitution may be employed in which a setting angle of the bars of the louver 41 may be varied in accordance with their respective positions in order to diffuse the radiated light from the plurality of light-emitting elements (light-emitting portion) more.

Figure 12:
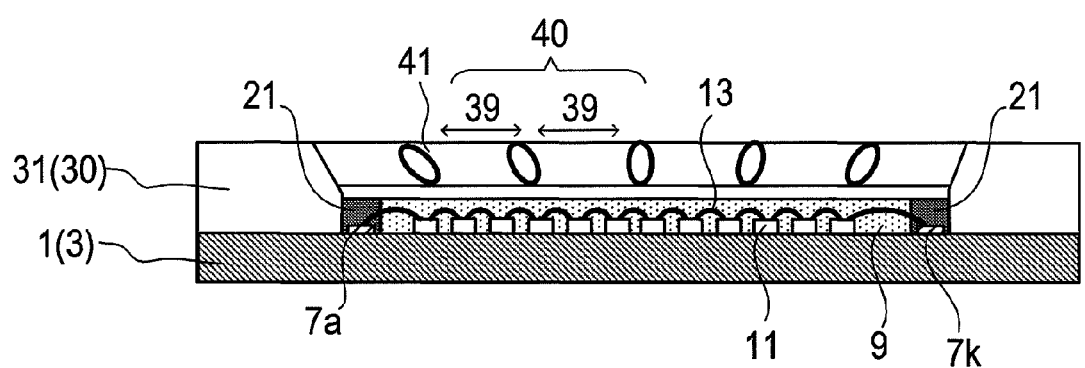
FIG. 12 is another schematic structure diagram showing a state where a light-emitting device and a jig for light control are overlaid.
Figure 13:
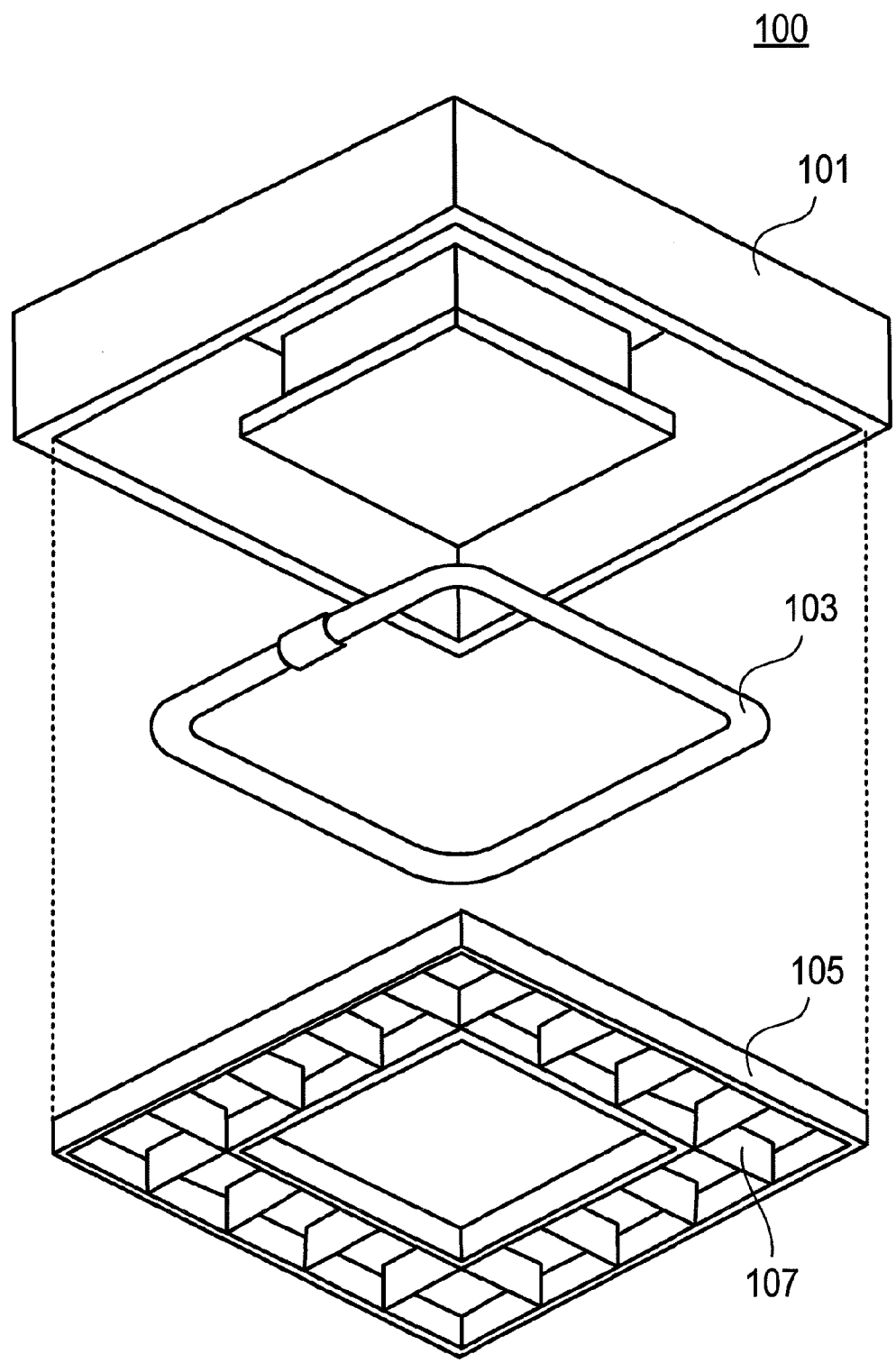
FIG. 13 is a schematic structure diagram of a conventional lighting system.
Figure 14:
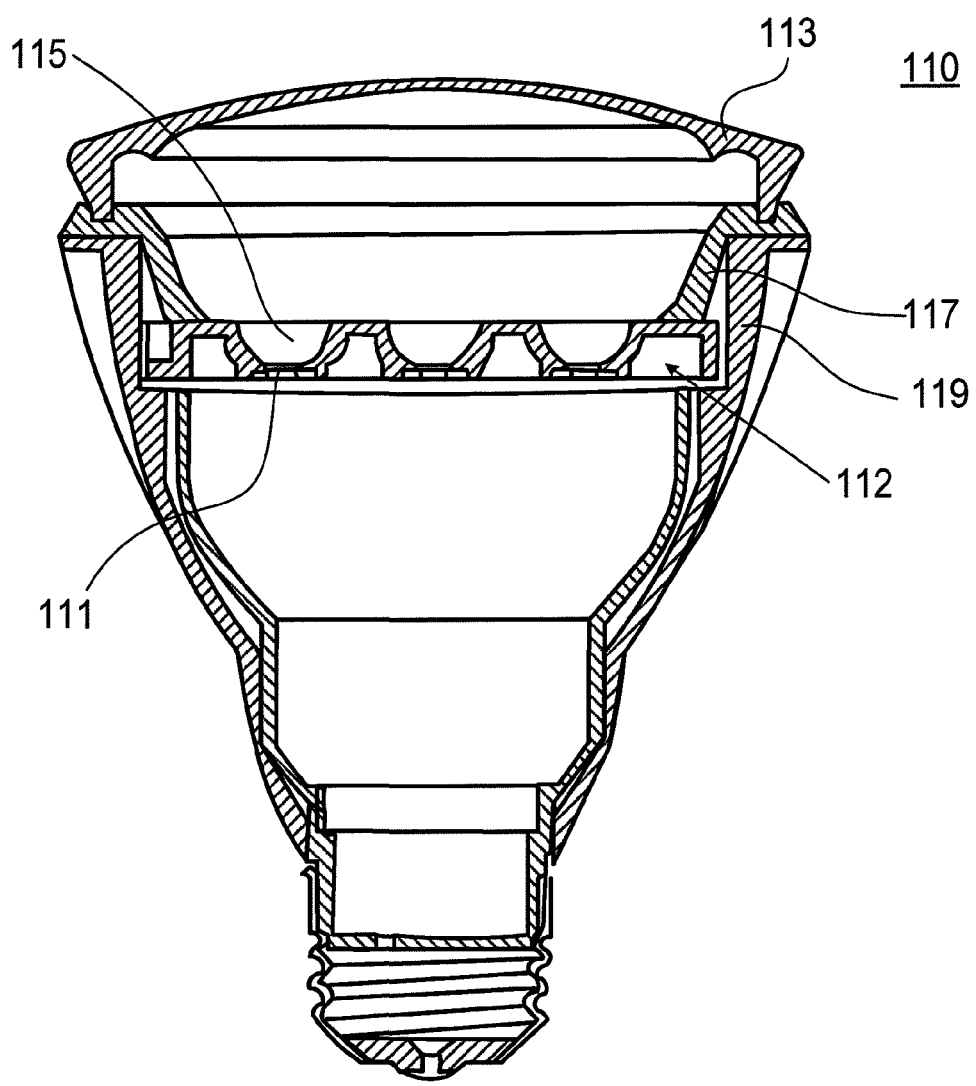
FIG. 14 is another schematic structure diagram of a conventional lighting system.

FIG. 12 is a cross-sectional diagram illustrated after FIG. 4B. According to FIG. 12, the bar of the louver 41 closer to a circumferential edge portion (the wiring patterns 7) is set with a larger angle with respect to the vertical line (so as to be inclined obliquely). This constitution enables the radiated light from the LED chips 11 to spread in an oblique direction, thereby making the light distribution angle larger.

(7) While in the above-described embodiment, the ceramic substrate is assumed as the substrate 3 making up the light-emitting device 1, a metal core substrate in which a metal substrate is used as a core, and on a surface of which an insulating layer is formed can be employed. Moreover, the jig for light control 31 may be a plate made of ceramic with a higher thermal conductivity in place of the resin plate. In this case, generated heat in the light-emitting device can be released not only from the case part but also from the jig for light control 31. Furthermore, by making the jig for light control 31 larger than the light-emitting device 1 so as to bring the jig for light control 31 into more contact with the case part, heat radiation paths from the jig for light control 31 to the case part are increased, which can promote the heat radiation of the light-emitting device more.

(8) While Au is assumed as the material of the electrode lands for connector connection 19, the present invention is not limited to Au, but the material preferably contains a conductive material having a function of preventing progression of oxidation. At this time, outermost portions with which the leads (the lead attached to the jig 45 in the structure in FIG. 5A, 5B) electrically connected to the connector make contact are preferably formed of this conductive material.

(9) While in the above-described embodiment, the constitution is assumed in which the adjacent LED chips 11 are directly electrically connected by the wires 13, a constitution in which they are connected through relay electrodes can be also employed.

(10) While in the above-described embodiment, the shapes of the electrode lands 17 and 19, the light-emitting device fixing holes 25, the jig-for-light-control fixing holes 33 and 35 are merely examples, and any other shapes may be employed.

(11) While in the above-described embodiment, the resin plate 30 making up the jig for light control 31 has almost the same size as that of the ceramic substrate 3 with the LED chips 11 mounted thereon, the size of the resin plate 30 may be arbitrary. However, in view of the downsizing of the lighting system 50, the size of the resin plate 30 is preferably made as small as possible in a range in which the LED chips 11 (and the phosphor-containing resin layer 9) are located below the small window-like discrete openings for light-emitting surface 39 formed by the louver 41 when the light-emitting device fixing holes 25 of the ceramic substrate 3 and the jig-for-light-control fixing holes 33 of the resin plate 30 are overlaid. That is, the structure is preferably such that when seen from a direction perpendicular to the surface where the light-emitting device and the jig for connector are overlaid, an outer circumference of the jig for connector 31 does not stick out outside an outer circumference of the light-emitting device 1.

On the other hand, when the light-emitting device 1 is fixed to the case part 51 to be used as in the lighting system 50 shown in FIG. 3, the size of the jig for light control 31 is made larger than that of light-emitting device 1, which enables fixing them only by the fixing holes of the jig for light control 31. For example, a mounting surface of the light-emitting device in the case part 51 has a depressed shape matching the size of the light-emitting device 1, and case-side connector portions which can be connected to an external power supply are set on an upper surface of the portion other than the depressed portion of the case part 51. The openings for connector terminals 35 are not provided in the jig for light control 31, but connector electrode portions of the jig for light control extending from portions corresponding to the openings for connector terminals 35 to portions which case part-side connector electrodes face when the jig for light control 31 is set on the case part are formed on the back surface side of the jig for light control 31. Moreover, screw holes are formed in portions on a surface of the case part corresponding to the fixing holes 33 of the jig for light control 31.

In this constitution, the light emitting device 1 is set on the depressed light-emitting mounting surface of the case part 51, and from above, the jig for light control 31 is placed on to be set so that the connector electrode portions of the jig for light control formed on the back surface of the jig for light control 31 are brought into contact with the electrode lands for connector connection 19 of the light-emitting device 1 and the case-side connector electrodes, and so that the fixing holes 33 of the jig for light control 31 are overlaid on the screw holes of the case part, and the screws are inserted into the fixing holes 33 and the screw holes of the case part to be fixed.

(12) While in the above-described embodiment, the light-emitting device 1 includes the printing resistive element 15, the printing resistive element need not be provided when the withstand voltage protecting function is not provided. As the element providing the withstand voltage protecting function, a Zener diode or the like may be mounted in place of the printing resistive element.

(13) While in the above-described embodiment, the series circuits in each of which the 12 LED chips 11 are connected in series are arranged in the 12 rows in parallel on the substrate 3, obviously, the number of the LED chips 11 connected in series, and the number of the series circuits arranged in parallel are not limited to this example. At this time, the number of chips connected in series need not be set equally to the number of the series circuits arranged in parallel, either.

Moreover, in the drawing of FIG. 1A, in the vicinity of the circumferential edge of the substrate where the number of the chips existing in the same row becomes smaller, the LED chips 11 in the adjacent rows are connected in series as needed to uniformize the number of LED chips 11 making up the series circuits. At this time, the LED chips 11 in the three or more adjacent rows may be incorporated as the components of one of the series circuits.

(14) While in the above-described embodiment, the connector 46 is inserted into the openings for connector terminals 35 inwards from the side surface portions of the resin plate 30, the insertion direction of the connector 46 is not limited to this. The shape of the leads 45 attached to the jig 31 to form the electric connection between the leads in the connector 42 and electrode lands for connector connection 19 is not limited to the spring shape as in the above-described embodiment.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A lighting system comprising:
   a light-emitting device that comprises a plurality of light-emitting elements arranged so as to be distributed on a substrate;
   a jig for light control that comprises a resin plate having a plurality of discrete openings for light-emitting surface partitioned by a louver and having another opening; and
   a connector terminal for external connection that is inserted into the another opening of the resin plate,
   wherein the light-emitting device and the jig for light control are overlaid so that the plurality of light-emitting elements are exposed from the plurality of discrete openings for light-emitting surface.

2. The lighting system according to claim 1, wherein the louver has a plurality of bars which define side surfaces of the discrete openings, and
   the louver is formed with an incline so that each of bars of the louver is inclined with a setting angle from the vertical direction to light-emitting surface.

3. The lighting system according to claim 2, wherein the louver is formed so that the bars of the louver are inclined at a lager setting angle as being further away from a central position of the louver.

4. The lighting system according to claim 1,
   wherein the plurality of light-emitting elements are covered with a sealing body, and
   the louver is arranged in a state where a bottommost surface of the louver is vertically spaced from a topmost surface of the sealing body, so that each of the discrete openings penetrates through the jig and light emitted from the light-emitting device does not pass through any solid material.

5. The lighting system according to claim 1, wherein the louver is formed into a grating shape when seen from a top surface.

6. The lighting system according to claim 5,
   wherein the plurality of light-emitting elements are connected in series in a predetermined first direction to form a series circuit, and the series circuits are plurally arrayed in parallel in a second direction perpendicular to the first direction, and
   the louver is arranged so that the number of bars of the louver crossing the first direction is larger than that of bars crossing the second direction.

7. The lighting system according to claim 2, wherein the louver is formed into a grating shape when seen from a top surface.

8. The lighting system according to claim 7,
wherein the plurality of light-emitting elements are connected in series in a predetermined first direction to form a series circuit, and the series circuits are plurally arrayed in parallel in a second direction perpendicular to the first direction, and
the louver is arranged so that the number of bars of the louver crossing the first direction is larger than that of bars crossing the second direction.

9. The lighting system according to claim 3, wherein the louver is formed into a grating shape when seen from a top surface.

10. The lighting system according to claim 9,
wherein the plurality of light-emitting elements are connected in series in a predetermined first direction to form a series circuit, and the series circuits are plurally arrayed in parallel in a second direction perpendicular to the first direction, and
the louver is arranged so that the number of bars of the louver crossing the first direction is larger than that of bars crossing the second direction.

11. The lighting system according to claim 1, wherein the louver forms a circular ring shape made of concentric circles or a part of the circular ring shape when seen from above.

12. The lighting system according to claim 2, wherein the louver forms a circular ring shape made of concentric circles or a part of the circular ring shape when seen from above.

13. The lighting system according to claim 3, wherein the louver forms a circular ring shape made of concentric circles or a part of the circular ring shape when seen from above.

14. The lighting system according to claim 1, wherein the plurality of discrete openings for light-emitting surface partitioned by the louver form a honeycomb shape.

15. The lighting system according to claim 2, wherein the plurality of discrete openings for light-emitting surface partitioned by the louver form a honeycomb shape.

16. The lighting system according to claim 3, wherein the plurality of discrete openings for light-emitting surface partitioned by the louver form a honeycomb shape.

17. The lighting system according to claim 1, wherein the louver is constructed to be detachable from the jig for light control.

18. A lighting system comprising:
a light-emitting device that comprises a plurality of light-emitting elements arranged so as to be distributed on a substrate; and
a jig for light control that comprises a resin plate having a plurality of discrete openings for light-emitting surface partitioned by a louver,
wherein the light-emitting device and the jig for light control are overlaid so that the plurality of light-emitting elements are exposed from the plurality of discrete openings for light-emitting surface,
the light-emitting device comprises, on the substrate, electrode lands for connector connection for external connection electrically connected to the plurality of light-emitting elements,
the jig for light control comprises, on the resin plate, openings for connector terminals into which connector terminals are inserted, and
the light-emitting device and the jig for light control are overlaid so that the electrode lands for connector connection and the openings for connector terminals are opposed.

19. The lighting system according to claim 1,
wherein the light-emitting device and the jig for light control are covered with a transparent cover member, and
light radiated from the plurality of light-emitting elements is guided outside the system through the plurality of discrete openings for light-emitting surface provided in the jig for light control, and the cover member.

20. The lighting system according to claim 1, wherein the plurality of light-emitting elements are LED elements.

* * * * *